United States Patent [19]

Tanaka

[11] 4,085,620
[45] Apr. 25, 1978

[54] PRESSURE-ELECTRIC TRANSDUCERS

[75] Inventor: Akio Tanaka, Kodaira, Japan

[73] Assignee: Tokyo Shibaura Electric Co., Ltd., Kawasaki, Japan

[21] Appl. No.: 727,536

[22] Filed: Sep. 28, 1976

[30] Foreign Application Priority Data

Sep. 30, 1975 Japan .................. 50-117902
Sep. 30, 1975 Japan .................. 50-117903
Apr. 16, 1976 Japan .................. 51-43406
Nov. 17, 1975 Japan .................. 50-155187[U]

[51] Int. Cl.² .................................. G01L 9/04
[52] U.S. Cl. .................. 73/727; 73/88.5 SD
[58] Field of Search ............ 73/88.5 SD, 398 AR; 338/4, 42

[56] References Cited

U.S. PATENT DOCUMENTS 3,520,191 7/1970 Pien ............................ 338/4 X
3,817,107 6/1974 Shimada et al. .......... 73/398 AR

FOREIGN PATENT DOCUMENTS 1,248,087 9/1971 United Kingdom ........... 73/398 AR

Primary Examiner—Charles A. Ruehl
Attorney, Agent, or Firm—Cushman, Darby & Cushman

[57] ABSTRACT

The transducer comprises a substrate made of stainless steel having an opening for receiving pressure transmitting fluid, a stress absorbing member having a connecting section with a fluid passage communicated with the opening and secured to the substrate, a neck section having a smaller diameter than the connecting section and integrally connected to the connecting section and a head section having a larger diameter than the neck section and integrally connected to the neck section, a semiconductor pressure sensitive element mounted on the head section with its pressure receiving surface disposed to close the fluid passage, said stress absorbing member having substantially the same linear expansion coefficient as the semiconductor pressure sensitive element, and terminals for deriving from the semiconductor pressure sensitive element an electrical signal corresponding to the pressure of said pressure transmitting fluid.

9 Claims, 18 Drawing Figures

PRESSURE-ELECTRIC TRANSDUCERS

This invention relates to a pressure-electric transducer utilizing a pressure sensitive element for producing an electric signal corresponding to fluid pressure.

A semiconductor pressure sensitive element made of silicon or germanium is usually mounted on a substrate through a supporting member and constructed to detect the fluid pressure at the exit of a fluid passage formed through the substrate and the supporting plate. Since the pressure of such corrosive fluids as petroleum, acids, alkaline liquids, or the like are detected so that it is necessary to construct at least the substrate which comes to contact with such corrosive fluids during use with materials, for example stainless steel, having a high corrosive-resistant property and high mechanical strength. The semiconductor pressure sensitive element, the supporting plate and the substrate are respectively bonded together by a thermosetting type binder or a fused glass. In each case the component parts are bonded together at a relatively high temperature, for example from 400° to 600° C. Where the supporting plate is made of material such as silicone or invar having a linear expansion coefficient comparable to that of a silicon or germanium from which the semiconductor pressure sensitive element is made of, there is no trouble caused by thermal expansion. However, when the linear expansion coefficients of the supporting plate and the substrate made of stainless steel are different by a factor of 10 there will be formed a large residual strain between the supporting plate and the substrate when the temperature thereof are returned to normal temperature after heat bonding. In the prior art pressure-electric transducer, such residual strain is transmitted to the semiconductor pressure sensitive element through the supporting plate whereby not only the measurement error due to the deformation of the element is increased but also the linearity and the sensitivity are decreased.

Although it has been considered to fabricate the supporting plate and the substrate as an integral unit by using the same material, silicone and invar are not suitable in view of their workability, corrosion resistance and mechanical strength.

Accordingly, it is the principal object of this invention to provide an improved pressure-electric transducer capable of preventing the conversion error due to the residual strain caused by the difference in the thermal expansion coefficients of the semiconductor pressure sensitive element and the substrate.

Another object of this invention to provide a novel pressure-electric transducer wherein a temperature compensation circuit for preventing the conversion error due to temperature variation is incorporated into a metal substrate together with a semiconductor pressure sensitive element so that the assembly can be handled as an integral structure.

Still another object of this invention is to provide a pressure-electric transducer provided with a temperature compensation circuit for compensating the output variation due to the sensitivity variation of the element caused by temperature variation.

A further object of this invention is to provide a novel pressure-electric transducer provided with a temperature compensation circuit for compensating the output variation due to the zero point shift caused by temperature variation.

According to this invention there is provided a pressure-electric transducer comprising a substrate having an opening for receiving pressure transmitting fluid; stress absorbing member having a connecting section provided with a fluid passage communicated with the opening and secured to the substrate, a neck section connected to the connecting section and having a smaller diameter than or the same diameter as the connecting section and a head section connected to the neck section and having a larger diameter than the neck section, the neck and the head sections being integral with the connecting section; a semiconductor pressure sensitive element mounted on the head section of the stress absorbing member with the pressure receiving surface of the pressure sensitive element disposed to close the fluid passage, the stress absorbing member having substantially the same linear expansion coefficient as the semiconductor pressure sensitive element; and means for deriving from the semiconductor pressure sensitive element an electrical signal corresponding to the pressure of the pressure transmitting fluid.

This invention can be more fully understood from the following detailed description when taken in conjunction with the accompanying drawings, in which.

Figure 1:
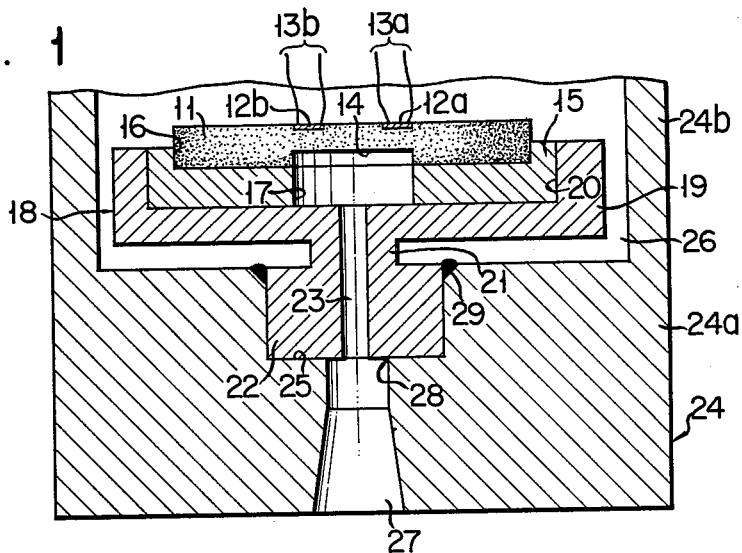
FIG. 1 is a sectional view showing one embodiment of the pressure-electric transducer embodying the invention.

Referring now to FIG. 1, the pressure-electric transducer shown therein comprises a circular disc shaped semiconductor pressure sensitive element 11 made of such semiconductor as silicon or germanium having a high anisotropy of the piezo-electric effect. The output of the pressure sensitive element 11 is supplied to an external circuit through a pair of variable resistance members 12a and 12b having opposite output polarities and lead wires 13a and 13b. A circular pressure receiving recess 14 is formed on the control portion of the bottom of the pressure sensitive element 11. The pressure sensitive element 11 is bonded to the inside of a circular recess 16 formed on the upper surface of a dish shaped inner holding member 15 having substantially the same linear expansion coefficient as the pressure sensitive element 11 such as silicone, covar, iron and invar. The inner holding member 15 is formed with a passage 17 for pressure fluid, and the element 11 and the holding member 15 are bonded together so that the passage 17 and the recess 14 align with each other.

In order to obtain a high bonding force, the pressure sensitive element 11 and the inner holding member 15 are bonded together by means of a thermosetting type bonding agent, fused glass or by gold-silicon alloy fusion method which utilizes the alloying effect between gold and silicon at the eutectic point. When using fused glass method the temperature of fusion is usually from 400° to 600° C whereas in the case of the gold-silicon alloy fusion method, an alloying temperature of about 370° C is used.

The inner holding member 15 is fitted in a circular recess 20 formed on a large diameter head section 19 of a stress absorbing outer holding member 18 made of material having substantially the same linear expansion coefficient, for example a silicone, covar, iron and invar and is bonded to the outer holding member 18 by similar bonding agent to that used for bonding the pressure sensitive element 11 to the inner holding member 15. A connecting section 22 having a smaller diameter than the head section 19 is connected to the head section 19 through a neck section 21 having a smaller diameter than that of the connecting section 22. The diameter of the connecting section 22 is made to be sufficiently large to increase the bonding force. The outer holding member 18 is provided with an axial fluid passage 23 having one end communicated with the fluid passage 17 in the inner holding member 15.

The connecting section 22 of the outer holding member 18 is received in a circular opening 25 formed in a metal substrate 24 made of metal having corrosion resistant property and a high mechanical strength, for example, stainless steel, and bonded to the substrate 24 by a thermosetting type binder or fused glass. The substrate 24 is formed with a vertical cylindrical flange 24b which surrounds the head section 19 with a definite gap 26. At the center of the substrate 24 is formed an axial opening 27 for receiving pressurized fluid, the upper end of the opening 27 being communicated with the fluid passage 23 of the outer holding member 18. Since the diameter of the pressure receiving opening 27 is made to be larger than that of the fluid passage 23, even when a portion of the bonding agent utilized to bond the connecting section 22 to the substrate 24 enters into the opening 27 it will not interfere with the flow of the fluid. The upper periphery of the opening 25 is slanted as at a cut portion 29 so as to receive surplus bonding agent utilized to bond the connecting section 22 to the substrate 24, so that the surplus bonding agent will not reach the head section 19, thus preventing the connection between the head section 19 and substrate 24. Accordingly it is possible to prevent the strain created in the substrate 24 from directly transmitting to the head section 19 through the bonding agent.

Figure 2:
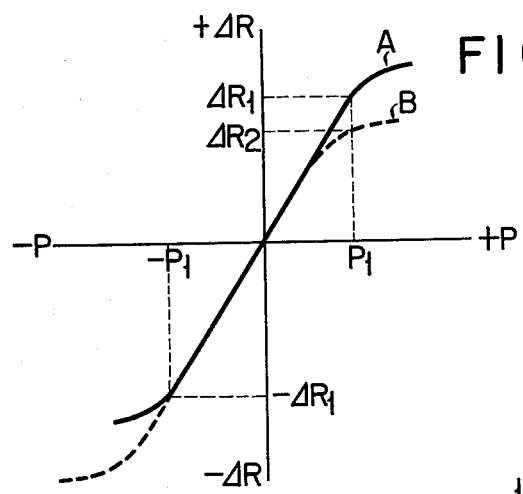
FIGS. 2 and 3 are graphs showing the operating characteristics of a prior art transducer and that shown in FIG. 1.

In the pressure-electric transducer shown in FIG. 1 since the linear expansion coefficients of the semiconductor pressure sensitive element 11 and the substrate 24 are $2 \times 10^{-6}$ and $19 \times 10^{-6}$ respectively, for example, the ratio thereof is about 1:10. However, the stress formed as the result of head bonding of the outer holding member 18 and the substrate 24 is substantially absorbed by the connecting section 22 and the neck section 21 provided for the outer holding member 18 and serving as stress absorbing members and is not transmitted to the head section 19. Further, as the semiconductor pressure sensitive element 11 and the inner and outer holding members 15 and 18 are made of materials having substantially the same linear expansion coefficient there is no fear of creating stress and strain between these elements due to temperature variation. For this reason, no stress and strain is created in the pressure sensitive element 11 not only during manufacturing but also during use so that it is possible to obtain a pressure-electric transducer having excellent linearity and sensitivity. In other words, the transducer produces an output signal across lead wires 13a and 13b of the pressure sensitive element 11 in response to only the pressure transmitted through the fluid filling the passages 27, 23 and 17 and recess 14.

Where pressures of $+P$ and $-P$ are applied to the pressure sensitive element 11 having a pair of variable resistance members, resistance variations $+\Delta R$ and $-\Delta R$ are obtained according to curve A shown in FIG. 2. In other words, the pressure sensitive element 11 manifests a resistance variation of $\pm \Delta R_1$ for a pressure variation of $\pm P_l$. Curve B shows the resistance variation of a modified pressure sensitive element wherein the outer holding member 18 shown in FIG. 1 is not used but the inner holding member 15 is bonded directly to the substrate 24 by a thermosetting resin applied at a temperature of 150° C. Since in this modified construction the stress and strain are transmitted to the pressure responsive element without being absorbed, a resistance variation of $\Delta R_2$ is caused by a pressure of $+P_y$. In this manner, due to the effect of stress and strain resistance variation of $\Delta R_1$ or $\Delta R_2$ is resulted by the same pressure $+P_l$ thereby causing a measurement error.

Figure 3:
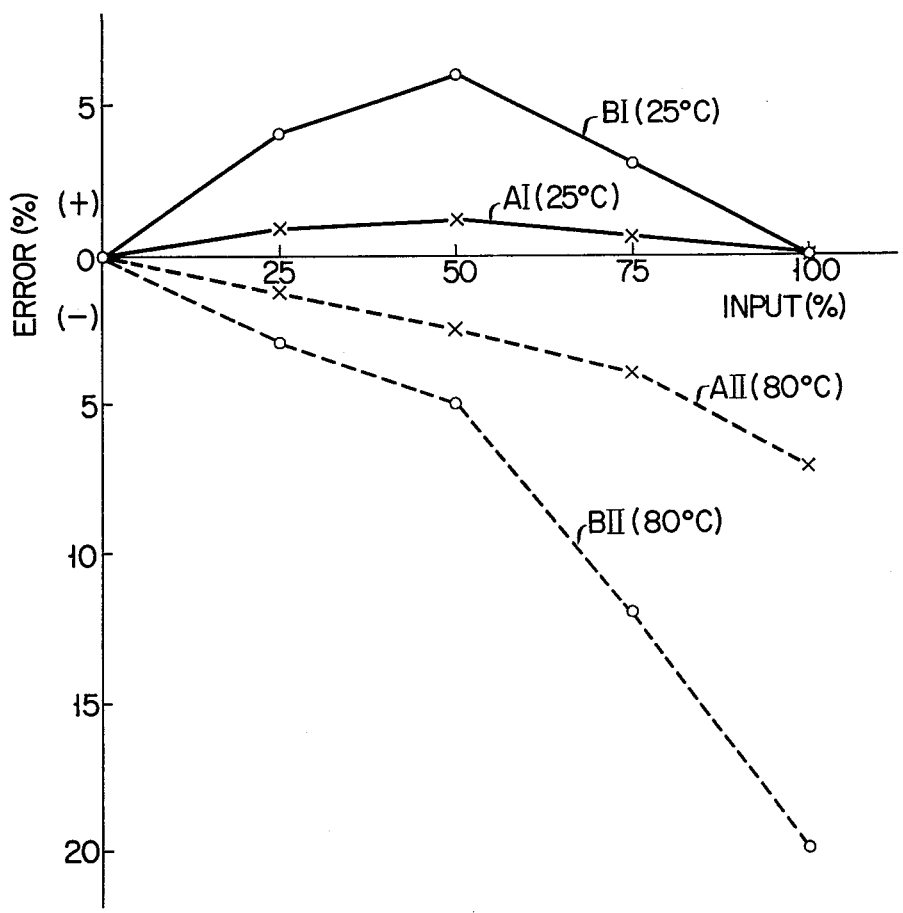

FIG. 3 shows the relationship between an input (%) and an error (%) at temperatures of 25° C (normal temperature) and 80° C. Thus, in the embodiment shown in FIG. 1, at the normal temperature, the input-error characteristic is shown by a curve AI in which the maximum error is only 1%. On the other hand, an element manifecting a pressure-resistance variation characteristic as shown by curve B shown in FIG. 2 manifests a maximum error of 6%. At 80° C, the embodiment shown in FIG. 1 shows a characteristic curve AII in which for a temperature variation of 80°−25° C=55° C, the maximum error is −7%. On the other hand, the element shown by curve B in FIG. 2 manifests a maximum error of −20% for a temperature variation of from 25° to 80° C. In the embodiment shown in FIG. 1, since a stress absorbing member 18 is used, the characteristic is improved greatly.

Figure 4:
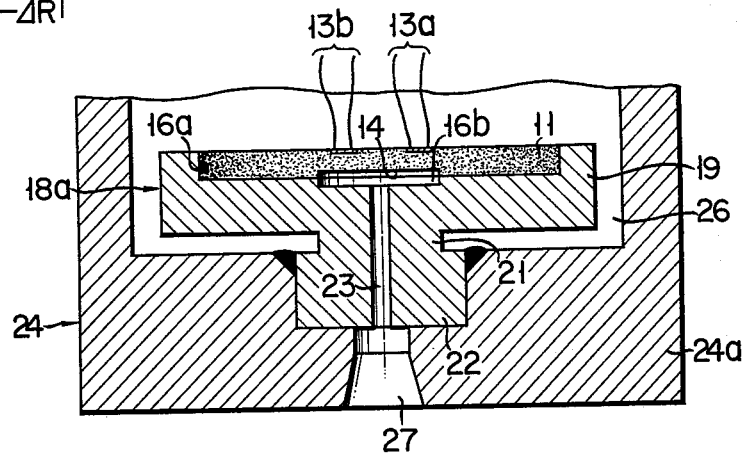
FIG. 4 is a sectional view showing a modified embodiment of this invention.

In a modified embodiment shown in FIG. 4, the semiconductor pressure sensitive element 11 is bonded to a circular recess 16a formed in the upper surface of a stress absorbing holding member 18a. At the center of the recess 16a is formed a circular recess 16b having the same diameter as the pressure receiving recess 14 of the pressure sensitive element 11 and the upper end of the fluid passage 23 is opened into the recess 16b. The other elements are identical to those of the FIG. 1 so that they are designated by the same reference numerals.

The embodiment shown in FIG. 4 is especially suitable for applications where the effect of external pressure is small, so that the element 11 is bonded directly to the stress absorbing outer holding member 18a without using the inner holding member 15 shown in FIG. 1, whereby the number of component parts and the number of the bonding steps are reduced.

Figure 5:
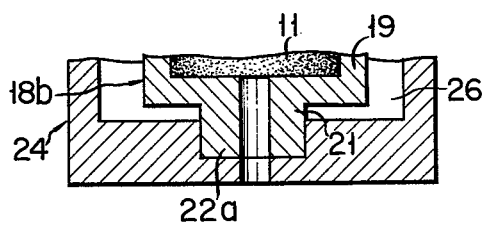
FIGS. 5 and 6 are sectional views showing a metal substrate and a supporting member for absorbing stress.

In the modification shown in FIG. 5, the connecting section 22a of the stress absorbing holding member 15b is constructed to have the same diameter as the neck section 21. In this case too so long as the diameters of the neck section 21 and the connecting section 22a are smaller than the diameter of the head section 19 the transmission of the stress from the substrate 24 is absorbed by the connecting section 22a and the neck section 21 and not transmitted to the head section 19 and the pressure sensitive element 11.

Figure 6:
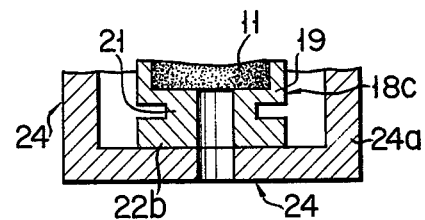

In the embodiments shown in FIGS. 1, 4 and 5, the connecting sections 22 and 22a of the stress absorbing members 18 and 18a are embedded in the substrate 24. It is also possible to heat bond the lower end of the connecting section 22b to the substrate 24, as shown in FIG. 6. In this case, the stress absorbing holding member 18c has a connecting section 22b having the same diameter as that of the head section 19, and the neck section 21 having a small diameter is formed between the head section 19 and the connecting section 22b. Again the stress created in the substrate 24 is absorbed by the connecting section 22b and the neck section 21 and not transmitted to the pressure sensitive element 11.

Figure 7:
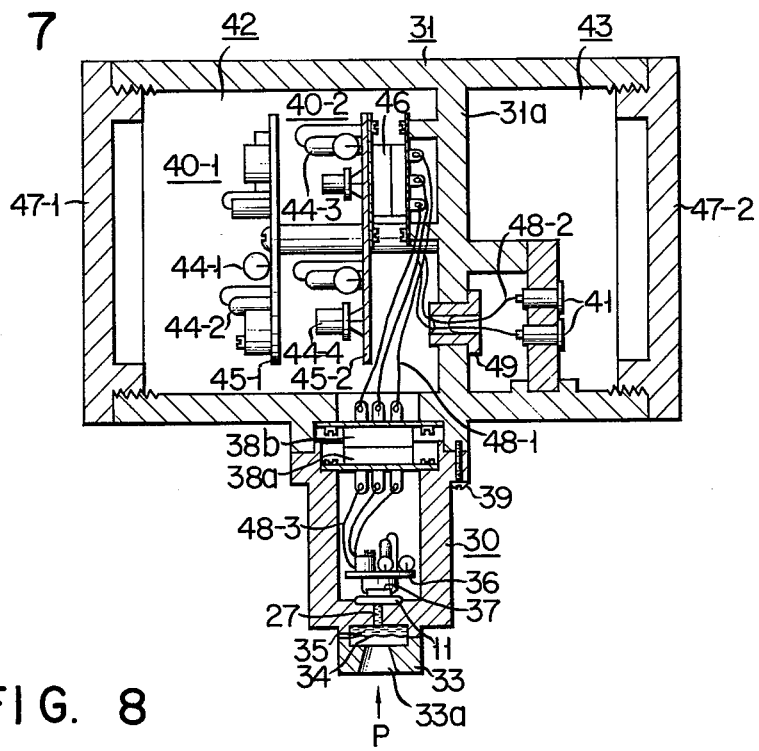
FIG. 7 is a sectional view showing the novel pressure-electric transducer of this invention and a temperature compensation circuit which are contained in detachable casings.

The pressure-electric transducer constructed as above described is combined with an electrical circuit to form a detection device as shown in FIG. 7. The detection device comprises a casing 30 for housing the detection section and a casing 31 for housing an amplifier. The substrate 24 shown in FIG. 1 may be used as the casing 30. A pressure admission casing 33 having a pressurized fluid inlet port 33a is secured to the lower end of the casing 30 via a diaphragms 34, which partitions a fluid passage 27 extending through the bottom of the casing 30 and the inlet port 33a. The space between the diaphragm 34 and the pressure sensitive element 11 is filled with pressure transmitting liquid 35 such as a silicone oil. The diaphragm 34 and the pressure transmitting liquid 35 are used for the purpose of preventing corrosive fluid from directly contacting the pressure sensitive element 11.

In the casing 30 is housed a temperature compensator 36 which compensates for the sensitivity variation of the pressure sensitive element 11 due to temperature variation or for zero point shift. Although, the detail of the circuit construction of the temperature compensator 36 will be described later, the signal input terminals are electrically connected to the terminal board 37 of the pressure sensitive element 11 and to the connector 38a closing the upper opening of the casing 30.

The detector casing 30 is removably secured to the amplifier casing 31 by screws 39. A connector 38b fitted to the connector 38a is mounted in the connecting portion of the casing 31. In this manner, connectors 38a and 38b are mounted in the connecting portion for casings 30 and 31 so that it is possible to connect and disconnect the casings 30 and 31 while containing therein the pressure sensitive element 11 and the temperature compensator 36 respectively.

The interior of the amplifier casing 31 is divided by a partition wall 31a into compartments 42 and 43 respectively containing amplifiers 40-1, 40-2 and external terminals 41. One compartment 42 contains electrical components 44-1, 44-2, 44-3 and 44-4 constituting an amplifying circuit, printed circuit boards 45-1, 45-2 for connecting and supporting these component parts and a connector 46. The terminals of the connector 46 are connected to the terminals of the connector 38b via lead wires 48-1 and to external terminals 41 contained in the compartment 43 through other lead wires 48-2 extending through the partition wall 31a. The external terminals 41 are connected to a source of power supply and other external circuits, not shown.

The openings of the compartments 42 and 43 are closed by threaded covers 47-1 and 47-2, respectively and the opening of the partition wall 31a for passing the lead wires 48-2 is sealed by a water tight packing 49.

The fluid pressure P to be measured is transmitted to the pressure receiving surface of the pressure sensitive element 11 through the diaphragm 34 and the pressure transmitting liquid 35 to supply an electric signal corresponding to the pressure P to the amplifiers 40-1 and 40-2 successively through temperature compensator 36, lead wires 48-3, connectors 38a and 38b, lead wires 48-1 and connector 46. The electrical signal amplified by amplifiers 40-1 and 40-2 is taken out as a pressure detection signal through the lead wires 48-2 and external terminals 41.

Where the amplifier 40 or the temperature compensator 36 becomes faulty, the detector casing 30 and the amplifier casing 31 are separated for exchanging either one of them with a new casing. This can be readily accomplished by removing screws 39 without the necessity of removing a member including a detector and an amplifier as in the prior art. Thus, for example, when the amplifiers 40-1 and 40-2 are exchanged, the detector casing 30 is retained in the place of installation so that it is not necessary to readjust the temperature compensator 36 because there is no change in the environment surrounding the temperature compensator.

Figure 8:
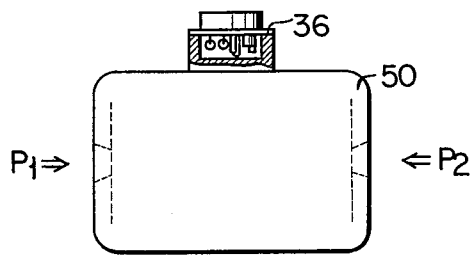
FIG. 8 is a side view, partly in section, of a modified embodiment of this invention which is designed to detect the difference between two fluid pressures.

Although in the embodiment shown in FIG. 7, the apparatus was constructed to detect only one fluid pressure P, where it is desired to detect the difference between two fluid pressures $P_1$ and $P_2$ as diagrammatically shown in FIG. 8, a temperature compensator 36 can be integrally combined with a detector casing 50. The temperature compensator 36 may be secured to or removably connected to the detector casing 50. Any well known device may be used to detect the difference between two fluid pressures $P_1$ and $P_2$ so that it is believed unnecessary to show and describe it.

Figure 9:
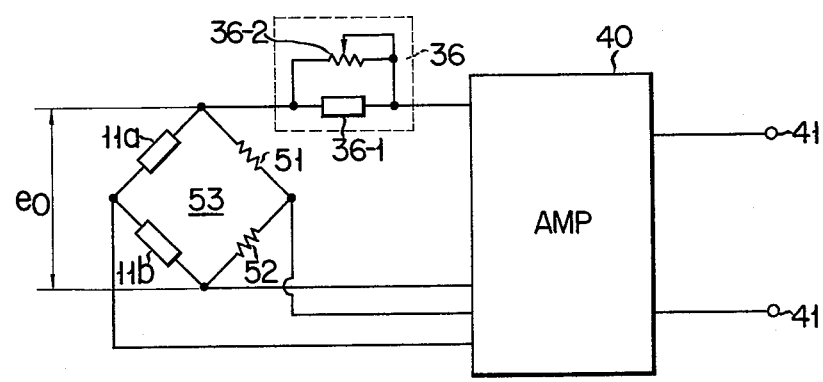
FIGS. 9 and 10 are block diagrams showing two temperature compensation circuits of different types.
Figure 10:
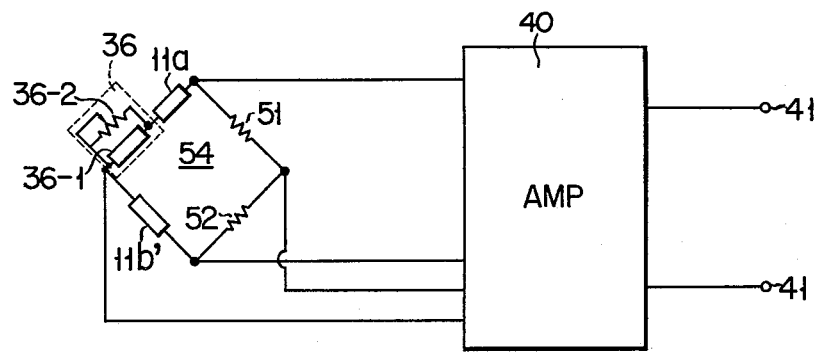

Since the sensitivity-temperature characteristic of the pressure sensitive element 11 is such that the output varies from 0.5 to 2% for a 10% variation in the temperature and that the characteristic varies for different elements it is advantageous to use a circuit as shown in FIG. 9 or 10. In the case shown in FIG. 9, the temperature compensation circuit 36 comprises a temperature sensitive element 36-1 such as a resistance element having a positive temperature coefficient, thermistor or a metallic resistance wire, and a variable adjusting resistor 36-2 connected in parallel with the temperature sensitive element 36-1. The temperature compensation circuit 36 is connected between an amplifier 40 and a bridge circuit 53 consisting of two pressure detection resistors 11a and 11b of the pressure sensitive element 11 having opposite characteristics, so as to adjust the input voltage $e_0$ applied to the bridge circuit 53. Resistor 11a may be made of a P-type semiconductor whereas the other resistor 11b made of an N type semiconductor. Thus, the temperature compensation circuit 36 provides so-called span temperature regulation, in which the sensitivity variation of the pressure sensitive element 11 due to the temperature variation is compensated for by adjusting the impressed voltage $e_0$.

In the modified circuit shown in FIG. 10, the temperature compensation circuit 36 is connected in series with one pressure detection resistor 11a of the pressure sensitive element 11 which comprises one arm of the bridge circuit 54. This circuit provides a so-called zero point temperature compensation wherein the resistance variation of the element 11 caused by temperature variation is compensated for by adjusting the output voltage of the bridge circuit 54.

Another examples of the temperature compensation circuit are shown in FIGS. 11 through 18. The circuit shown in FIG. 11 corresponds to that shown in FIG. 10 and the resistance values of the detection resistors 11a and 11b of the pressure sensitive element 11 having opposite polarity characteristics shown by $R_1$ and $R_2$ respectively. A resistor having a resistance value $R_3$ is connected in series with one detection resistor $R_1$. As this resistor $R_3$ may be used a resistor which is not affected by temperature variation such as a wound resistor or a metal coated resistor. The other two arms of the bridge circuit 55 are constituted by reference resistors $RS_1$ and $RS_2$ having a resistance value RS and corresponding to resistors 51 and 52 shown in FIG. 10. An input voltage VI is impressed across a juncture between resistors $RS_1$ and $R_3$ and a juncture between resistors $RS_2$ and $R_2$ and a pressure detection signal $V_0$ is derived out from a juncture between resistors $R_1$ and $R_2$ and a juncture between resistors $RS_1$ and $RS_2$. Resistor $R_3$ is a fixed resistor constructed not to be influenced by temperature so that it can be located at any location remote from the pressure sensitive element 11.

Figure 12:
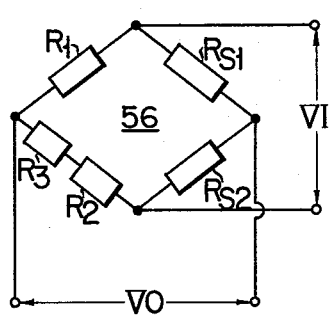
FIGS. 12 and 13 are connection diagrams showing other examples of temperature compensation circuits capable of correcting a zero point.

In the example shown in FIG. 12, a resistor $R_3$ which is not affected by temperature variation is connected in series with the other pressure detection resistor $R_2$ of the pressure sensitive element.

Whether the resistor $R_3$ should be connected in series with resistor $R_1$ or resistor $R_2$ is determined by the ratio $R_2/R_1$ of two resistors $R_2$ and $R_1$ at a reference temperature and the resistance value ratio $R_{2T}/R_{1T}$ of two resistors $R_1$ and $R_2$ at a temperature T.

Figure 11:
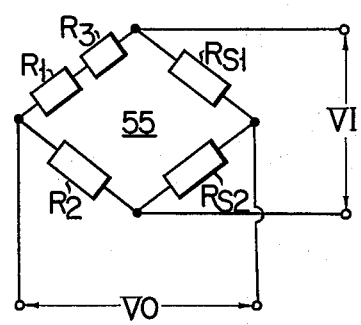
FIG. 11 is a connection diagram showing one example of a temperature compensation circuit capable of correcting a zero point.

In the pressure detection system described above, where a relation $R_2/R_1 > R_{2T}/R_{1T}$ is established due to temperature variation, a resistor $R_3$ not affected by temperature variation is connected in series with resistor $R_1$ as shown in FIG. 11. In this case, the resistor $R_3$ having a resistance value that satisfies a relation $$\frac{R_2}{R_1 + R_3} = \frac{R_{2T}}{R_{1T} + R_3}$$

for any temperature variation is used. In other words, the resistor $R_3$ not affected by temperature variation has a value $$R_3 = \frac{R_{2T} \cdot R_1 - R_2 \cdot R_{1T}}{R_2 - R_{2T}} \tag{1}$$

By connecting resistor $R_3$ having a value determined by the equation (1) in series with resistor $R_1$ it is possible to maintain the ration $R_2/R_1$ at a constant value even when the values of resistors $R_1$ and $R_2$ vary in accordance with temperature variation. Accordingly, the zero point of the output $V_0$ from the bridge circuit 55 is maintained at a constant point.

Where a relation $R_2/R_1 < R_{2T}/R_{1T}$ is established due to temperature variation, a resistor $R_3$ not affected by temperature variation is connected in series with resistor $R_2$ as shown in FIG. 12. More particularly, resistor $R_3$ having a value that satisfies a relation $$\frac{R_2 + R_3}{R_1} = \frac{R_{2T} + R_3}{R_{1T}}$$

should be used. In this case, the value of resistor $R_3$ not affected by temperature variation is determined by the following equation $$R_3 = \frac{R_1 \cdot R_{2T} - R_2 \cdot R_{1T}}{R_{1T} - R_1} \tag{2}$$

In this case too, when the value of resistor $R_3$ satisfies equation (2) it is possible to maintain the zero point of the output voltage $V_0$ from the bridge circuit 56 at a constant value in the same manner as in the circuit shown in FIG. 11.

Denoting the temperature coefficients of the pressure detection resistors $R_1$ and $R_2$ by $\alpha$ and $\beta$, respectively, and when it is assumed that the values of resistors $R_1$ and $R_2$ vary to $R_{1T}$ and $R_{2T}$, respectively, due to a temperature variation of T° C, then the resistance values $R_{1T}$ and $R_{2T}$ are shown by the following equations.

$$R_{1T} = R_1(1 + \alpha T) \tag{3}$$

$$R_{2T} = R_2(1 + \beta T) \tag{4}$$

By substituting equations (3) and (4) into equation (2), the value of the resistor $R_3$ not affected by temperature variation is expressed by the following equation $$R_3 = \frac{R_{2T} - R_2 \frac{R_{1T}}{R_1}}{\frac{R_{1T}}{R_1} - 1} = \frac{R_2(1 + \beta T) - R_2(1 + \alpha T)}{(1 + \alpha T) - 1} = \frac{R_2(\beta - \alpha)}{\alpha} \tag{5}$$

In this manner, the value of the resistor $R_3$ is determined by only the constants of $R_2$, $\alpha$ and $\beta$ independently of the temperature T.

Figure 13:
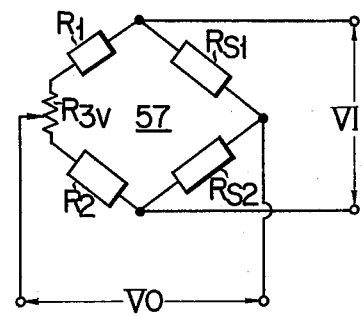

In the example shown in FIG. 13, a variable resistor $R_{3\nu}$ not affected by temperature variation is connected between pressure detection resistors $R_1$ and $R_2$, and the output $V_0$ of the bridge circuit 57 is derived out from the sliding arm of the resistor $R_{3\nu}$ and the juncture between resistors $R_{S1}$ and $R_{S2}$. In this case too, by adjusting the variable resistor $R_{3\nu}$ in accordance with the relative magnitudes of the ratios $R_2/R_1$ and $R_{2T}/R_{1T}$ it is possible to provide a temperature compensation of the zero point in the same manner as in the cases of FIGS. 9 and 10.

In the examples shown in FIGS. 11, 12 and 13, the resistors $R_3$ and $R_{3\nu}$ utilized for the temperature compensation of the zero point are not affected by temperature variation so that it is not necessary to subject these resistors to the same temperature as the pressure sensitive element. Accordingly, the design of the apparatus is easy because these resistors can be located at any position. Furthermore, since it is not necessary to cause resistors $R_3$ and $R_{3\nu}$ to have the same temperature coefficient as the pressure sensitive element, the selection of the resistor material is easy. As can be clearly noted from equation (5), since the resistors $R_3$ and $R_{3\nu}$ are theoretically independent of any temperature variation, it is possible to provide highly accurate temperature compensation.

Figure 14:
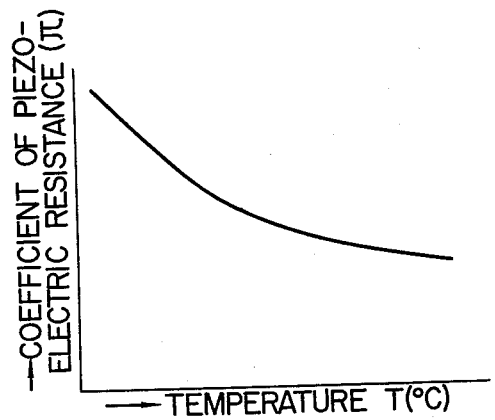
FIG. 14 is a graph showing the relationship between the temperature and sensitivity of a semiconductor pressure sensitive element.
Figure 15:
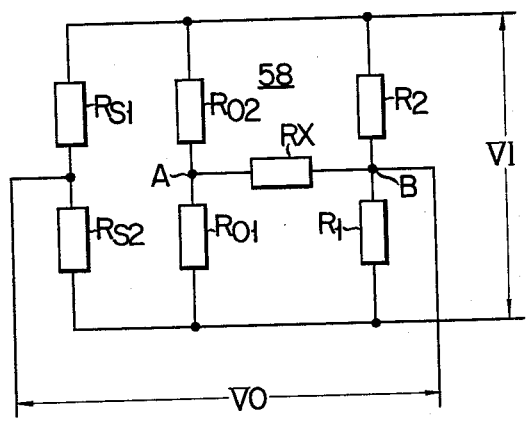
FIG. 15 is a connection diagram showing a circuit for compensating the sensitivity variation caused by the temperature variation.

Various examples of the temperature compensation circuit for the sensitivity will now be described with reference to FIGS. 14 through 18. The sensitivity of the semiconductor pressure sensitive element 11 shown in FIG. 11, for example, is proportional to the piezoelectric resistance coefficient $\pi$ the temperature dependency of the coefficient $\pi$ is expressed by the following equation $$\pi \propto e^{A/T} \qquad (6)$$

where A represents a constant, and T a temperature in ° C. The graph shown in FIG. 14 shows equation (6), in which the ordinate represents the piezoelectric resistance coefficient $\pi$ and the abscissa the temperature T in ° C. This graph shows that as the temperature increases the piezoelectric resistance coefficient $\pi$ decreases exponentially. By experiment it was determined that the rate of decrease in the sensitivity is about 7% per 50° C. A temperature compensation circuit as shown in FIG. 15 is used to compensate for the decrease in the sensitivity caused by temperature rise. Like FIGS. 11, 12 and 13, resistors $R_1$, $R_2$, and resistors $R_{S1}$, $R_{S2}$ shown in FIG. 15 are the pressure detection resistors and the reference resistors, respectively. Further, serially connected resistors $R_{O1}$ and $R_{O2}$ are connected across the input terminals and a temperature compensation resistor RX is connected across the juncture A between resistors $R_{O1}$ and $R_{O2}$ and the juncture B between resistors $R_1$ and $R_2$ to form a bridge circuit 58. The values of th fixed resistors $R_{O1}$ and $R_{O2}$ are set such that when no pressure is applied to the pressure sensitive element, the bridge circuit 58 constituted by the pressure detection resistors $R_1$ and $R_2$ and the fixed resistors $R_{O1}$ and $R_{O2}$ will be at a ballanced condition and the potential difference between points A and B will be zero.

When a fluid pressure is applied on the pressure sensitive element and the values of the pressure detection resistors $R_1$ and $R_2$ vary, the bridge circuit 58 becomes unballanced whereby a potential difference appears across points A and B to pass current through the temperature compensation resistance element RX. In the absence of this element RX the resistivity of the resistors $R_1$ and $R_2$ is caused to vary by temperature variation thereby changing the amount of variation in the potential at point B caused by the application of the pressure. The temperature dependency of the amount of variation of the potential at point B causes direct variation in the sensitivity of the output $V_O$. However, as the temperature compensation resistance element RX whose resistance varies in accordance with the temperature is connected across points A and B it is possible to make the potential variation at point B to be dependent upon the pressure alone. More particularly, assuming that the potential of point B varies by VOT due to the connection of the compensation resistance element RX, the temperature-resistance coefficient is selected such that the voltage variation $V_{OT}$ will be constant irrespective of the temperature variation when a constant voltage is applied. Then it would be possible to establish a definite relationship between the coefficient $\Delta RX$ and the ratio VTP/VOT where VTP represents the potential of point B where the element RX is not used. Suppose now that the temperature rises under a constant pressure so that the sensitivity of the pressure sensitive element decreases as shown in FIG. 14, the potential at point B would tend to decrease. At this time, however, the resistance value of the compensation element RX increases with the result that the current flowing to the point A at a fixed potential through the compensation element decreases. Thus decrease in the potential of point B is prevented and the output voltage $V_O$ is maintained at a constant value irrespective of the temperature variation. For a pressure sensitive element which decreases its sensitivity with temperature rise as shown in FIG. 14, a resistor element having positive temperature characteristic is used as the compensation element RX. In the opposite case, a thermistor may be used.

Figure 16:
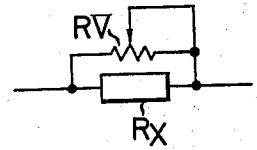
FIGS. 16, 17 and 18 show three different compensation circuits utilized in the circuit shown in FIG. 15.
Figure 17:
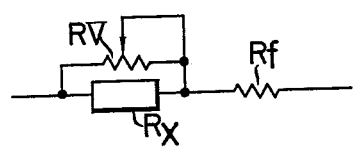
Figure 18:
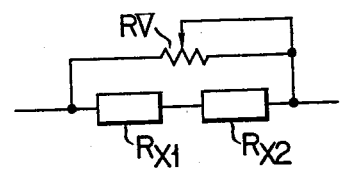

Actually, however, as the compensation element, a positive temperature characteristic resistor element or a thermistor is not used singly but, as shown in FIG. 16, a variable resistor RV may be connected in parallel with the compensation element RX, or as shown in FIG. 17, a fixed resistor $R_f$ may be connected in series with the combination shown in FIG. 16 for adjusting the amount of compensation or for aligning the values of the pressure detection resistors $R_1$ and $R_2$. Alternatively, as shown in FIG. 18 two compensation resistors $RX_1$ and $RX_2$ may be connected in series to increase the matching effect with resistors $R_1$ and $R_2$.

What is claimed is:

1. A pressure-electric transducer comprising a substrate having an opening for receiving pressure transmitting fluid; a stress absorbing member having a connecting section provided with a fluid passage communicated with said opening and secured to said substrate, a neck section connected to the connecting section and having a diameter not larger than that of the connection section and a head section connected to the neck section and having a diameter larger than that of said neck section, said neck and said head sections being integral with said connecting section; a semiconductor pressure sensitive element mounted on the head section of said stress absorbing member with the pressure receiving surface of said pressure sensitive element disposed to close said fluid passage, said stress absorbing member having substantially the same linear expansion coefficient as said semiconductor pressure sensitive element; and means for deriving from said semiconductor pressure sensitive element an electric signal corresponding to the pressure of said pressure transmitting fluid, a detection casing containing said semiconductor pressure sensitive element, a temperature compensator contained in said detection casing and electrically connected to said pressure sensitive element, an amplifier casing removably connected to said detection casing, and an amplifier contained in said amplifier casing for amplifying said derived electric signal.

2. A pressure-electric transducer according to claim 1 wherein said semiconductor pressure sensitive element comprises first and second pressure detection resistors having opposite resistance variation characteristics under pressure and said temperature compensator comprises first and second reference resistors which are connected with said first and second pressure detection resistors to form a bridge circuit.

3. A pressure-electric transducer according to claim 2 which further comprises a resistor not affected by temperature variation and connected in series with one of said first and second pressure detection resistors so as to provide a temperature compensation of the zero point of the output from said bridge circuit.

4. A pressure-electric transducer according to claim 2 which further comprises a resistor not affected by temperature variation and connected to the common juncture of said first and second pressure detection resistors so as to provide a temperature compensation of the zero point of the output from said bridge circuit.

5. A pressure-electric transducer according to claim 2 which further comprises a potentiometer connected across a source for energizing said bridge circuit and producing a fixed potential on an intermediate point thereof; and a compensation circuit including a resistor connected between said intermediate point and the juncture between said first and second pressure detecting resistors, said resistor varying its resistance value in accordance with the temperature variation so as to compensate for the variation of the output from said bridge output caused by the variation in the sensitivity of said semiconductor pressure senstive element due to temperature variation.

6. A pressure-electric transducer according to claim 5 wherein said compensation circuit comprises a temperature sensitive element and at least one variable resistor connected in parallel to said temperature sensitive element.

7. A pressure-electric transducer according to claim 5 which further comprises a fixed resistor connected in series with said parallelly connected temperature sensitive element and said variable resistor.

8. A pressure-electric transducer according to claim 1 wherein said substrate and said connecting section are connected together by means of a bonding agent, and a recess is provided at one end of the bonding surface to receive surplus bonding agent.

9. A pressure-electric transducer according to claim 1, wherein said detection casing detects the difference between two fluid pressures.

* * * * *